(12) United States Patent
Letavic et al.

(10) Patent No.: US 6,414,365 B1
(45) Date of Patent: Jul. 2, 2002

(54) THIN-LAYER SILICON-ON-INSULATOR (SOI) HIGH-VOLTAGE DEVICE STRUCTURE

(75) Inventors: Ted Letavic, Putnam Valley; Mark Simpson, White Plains, both of NY (US)

(73) Assignee: Koninklijke Philips Electronics N.V., New York, NY (US)

( * ) Notice: Subject to any disclaimer, the term of this patent is extended or adjusted under 35 U.S.C. 154(b) by 0 days.

(21) Appl. No.: 09/968,121

(22) Filed: Oct. 1, 2001

(51) Int. Cl.[7] .............................................. H01L 29/94
(52) U.S. Cl. ....................... 257/409; 257/347
(58) Field of Search ................... 257/353, 354, 257/409, 347

(56) References Cited

U.S. PATENT DOCUMENTS 5,483,482 A * 1/1996 Yamada et al. ............. 257/906
5,888,854 A * 3/1999 Morihara ..................... 438/155
2001/0033024 A1 * 10/2001 Fraser et al. ................. 257/758

* cited by examiner

Primary Examiner—Allan R. Wilson
(74) Attorney, Agent, or Firm—Steven R. Biren

(57) ABSTRACT

A thin layer SOI high-voltage device in which the drift charge is depleted using a three-dimensional MOS capacitor structure. The drift region of the high-voltage semiconductor device is doped with a graded charge profile which increases from source-to-drain. The drift region is physically patterned to create a stripe geometry where individual SOI stripes. Each SOI stripe is individually circumscribed longitudinally by a dielectric layer wherein each dielectric layer is longitudinally circumscribed by field plates of a conducting multi-capacitor field plate layer which is electrically shorted to the substrate. The resultant structure is a thin drift-region stripe which is completely enclosed by a MOS field plate, resulting in three-dimensional depletion upon application of a bias voltage between the SOI stripe and its encapsulating field plates.

18 Claims, 5 Drawing Sheets

THIN-LAYER SILICON-ON-INSULATOR (SOI) HIGH-VOLTAGE DEVICE STRUCTURE

FIELD OF THE INVENTION

This invention relates to semiconductor devices, and more particularly to a thin-layer silicon-on-insulator (SOI) high-voltage device structure which employs multiple three-dimensional metal-oxide semiconductor (MOS) capacitor structures to achieve multi-dimensional depletion of the drift charge to improve the breakdown-voltage specific "on" resistance figure-of-merit across a wide range of application voltages.

BACKGROUND OF THE INVENTION

There has been various SOI high voltage device structures in which a field plate construction and drift region doping are used to improve the breakdown voltage specific "on" resistance figure-of-merit. Improved "on" resistance for low voltage application has been obtained using trench device structures in bulk silicon technology. Other thin-layer high voltage devices have improved current driving capability.

Recently, multi-dimensional depletion in the drift region has been achieved by inserting shaped PN-junctions into the graded-doped drift region of the device. Thus, the device could support high voltages with higher levels of charge in the drift region, without extensive thermal oxidation process steps. However, there is an alternative structure in which a MOS dielectric can be used to support higher sustainable electric fields. Such a construction can be used to improve the breakdown voltage specific "on" resistance figure-of-merit.

SUMMARY OF THE INVENTION

The present invention contemplates a thin-layer silicon-on-insulator (SOI) high voltage device comprising a semiconductor substrate and a three-dimensional MOS multi-capacitor structure which forms a depletable drift region. The three-dimensional MOS multi-capacitor structure includes a striped geometry of parallel thin, SOI stripes, wherein each SOI stripe is individually circumscribed longitudinally by a respective dielectric layer formed on the semiconductor substrate, and a conducting multi-capacitor field plate layer superimposed on top of the respective dielectric layer and between adjacent dielectric layers circumscribing longitudinally adjacent SOI stripes.

DETAILED DESCRIPTION OF THE INVENTION

Figure 3A:
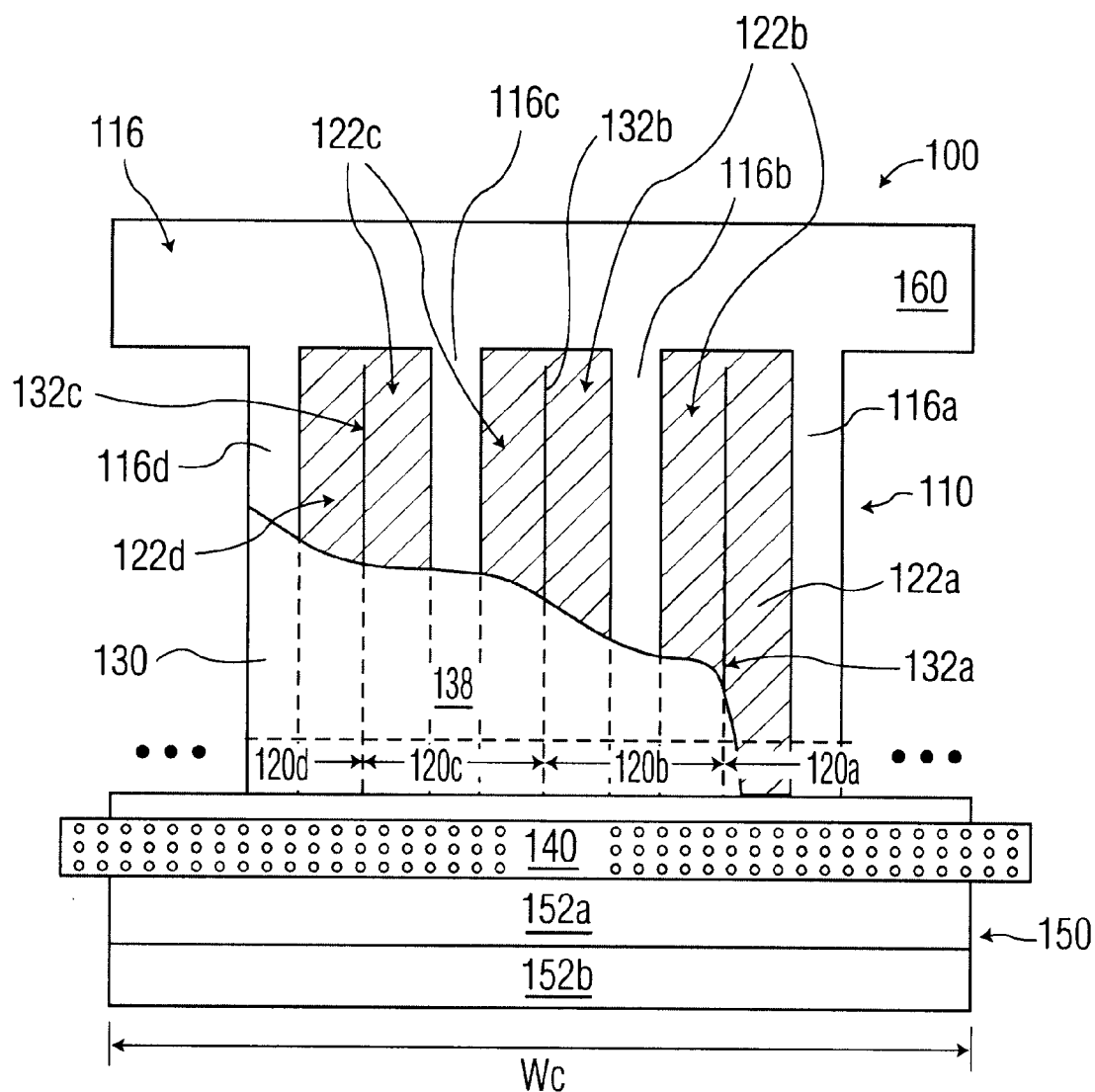
FIG. 3A illustrates a top view of a lateral diffused metal-oxide semiconductor (LDMOS) device structure of the present invention employing the three-dimensional MOS multi-capacitor structure of FIG. 1.

Referring now to FIG. 3A, an alternate way to achieve multi-dimensional depletion in a thin-layer SOI device 100, such as without limitation, a LDMOS device, is to insert a MOS field plate multi-capacitor structure 110 in the drift region which is biased to deplete the drift charge. This has the same effect on the device's performance as in the prior art, namely providing a higher level of doping in the drift region for a specified breakdown voltage. The MOS field plate multi-capacitor structure 110 has a benefit over the PN-junction depletion method in that the MOS dielectric can support higher electric field strengths prior to breakdown. This means that (ideally) the MOS field plate multi-capacitor scheme would have a better breakdown voltage specific "on" resistance figure-of-merit.

Figure 1:
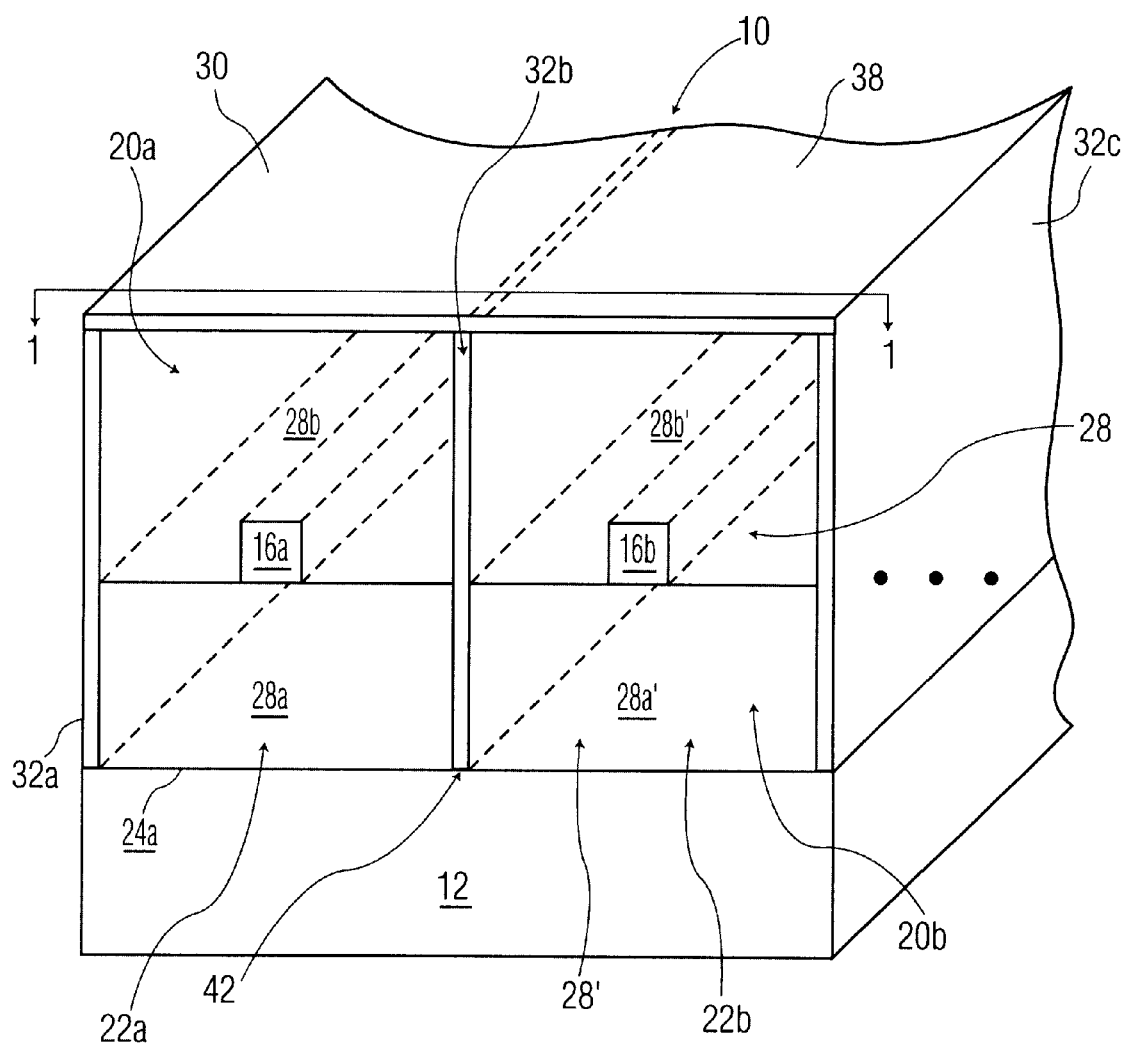
FIG. 1 illustrates a three-dimensional MOS multi-capacitor structure of a drift region of the present invention.
Figure 2:
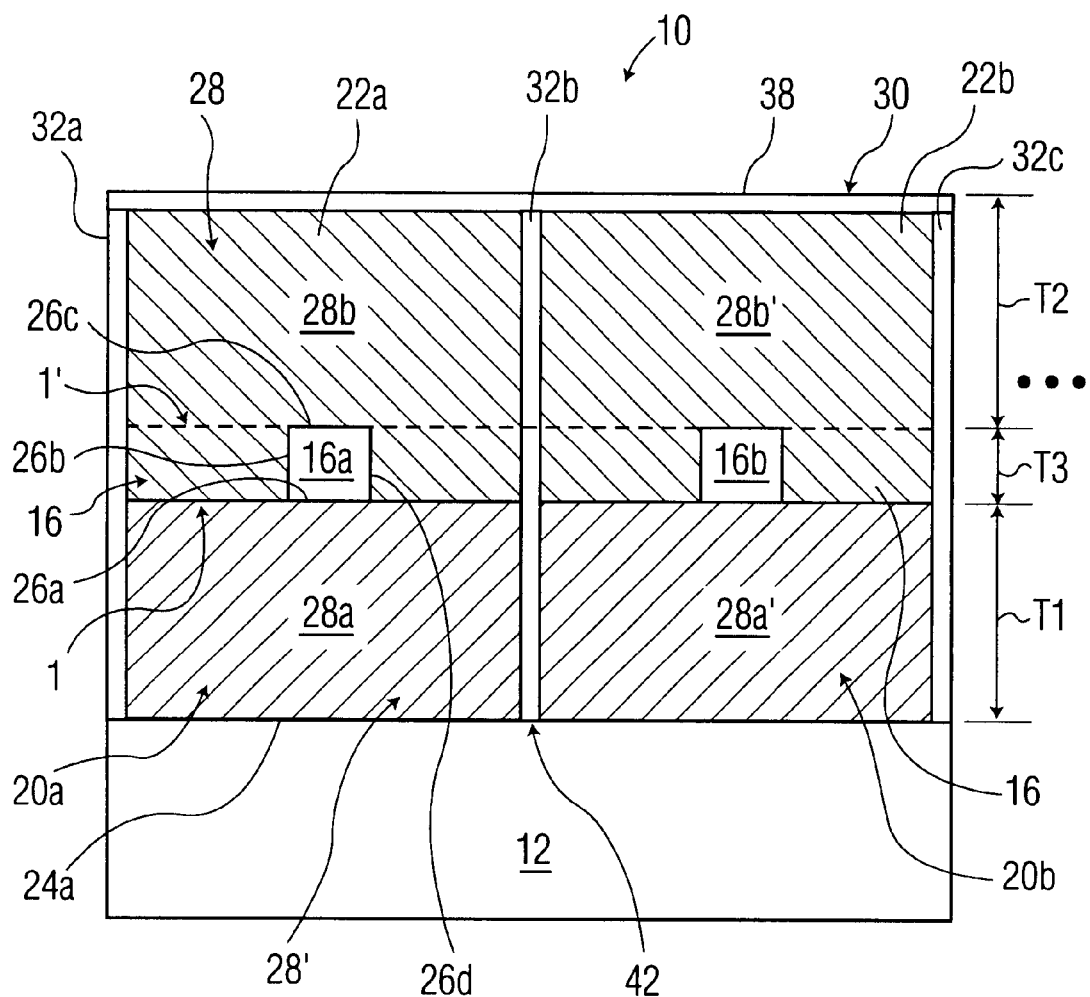
FIG. 2 illustrates a cross sectional view along the plane 1—1 of the embodiment of FIG. 1.

Referring now to FIGS. 1 and 2, an exemplary MOS field plate multi-capacitor structure 10 will be described in detail below. The exemplary MOS field plate multi-capacitor structure 10 as shown includes two parallel and juxtaposed MOS capacitors 20a and 20b. However, any number of parallel and juxtaposed MOS capacitors can be provided. The MOS field plate multi-capacitor structure 110 of FIG. 3A includes more than two MOS capacitors, as will be described in more detail later.

The MOS field plate multi-capacitor structure 10 includes a plurality of SOI stripes 16a and 16b, each of which is individually encapsulated, sealed or circumscribed longitudinally by dielectric layers 22a and 22b, respectively, disposed on a semiconductor substrate 12, such as, without limitation, a silicon substrate. The semiconductor substrate 12 may have either a N-type conductivity or a P-type conductivity.

The dielectric layer 22a has a bottom periphery surface 24a disposed on the semiconductor substrate 12 and its interior periphery surfaces 26a, 26b, 26c and 26d circumscribing the top, bottom and longitudinal exterior periphery surfaces of the SOI stripe 16a. Likewise, dielectric layer 22b circumscribes the SOI stripe 16b. In the exemplary embodiment, the dielectric layers 22a and 22b are made of silicon dioxide, also referred to as "oxide." However, any dielectric with a low dielectric constant could be used.

The dielectric layer 22a is comprised of a buried insulating layer 28a having the SOI stripe 16a disposed thereon and a top insulating layer 28b disposed over the top of and longitudinally along the SOI stripe 16a. The SOI stripe 16a is in the form of a geometrically-shaped stripe or strip having a width which is shorter than the width of the buried insulating layer 28a and the top insulating layer 28b. The thicknesses of the SOI stripe 16a, the buried insulating layer 28a and the top insulating layer 28b will be described below in relation to the fabrication process. Since SOI stripe 16a has a shorter width than the buried insulating layer 28a and the top insulating layer 28b, the top and side periphery surfaces of the SOI stripe 16a are longitudinally circumscribed by the top insulating layer 28b while the bottom surface is interfaced by the buried insulating layer 28a. Likewise, dielectric layer 22b is comprised of buried insulating layer 28a' and top insulating layer 28b'.

The MOS field plate multi-capacitor structure 10 further includes a conducting multi-capacitor field plate layer 30 superimposed longitudinally on top of the dielectric layers 22a and 22b and between the adjacent dielectric layers 22a and 22b circumscribing longitudinally adjacent SOI stripes 16a and 16b.

More specifically, the conducting multi-capacitor field plate layer 30 includes a plurality of longitudinal dividing field plates 32a, 32b and 32c and a top longitudinal field plate 38. As can be appreciated, in this exemplary embodiment, field plate 32b is shown dividing SOI stripe 16a and 16b and their respective dielectric layers 22a and 22b, respectively. However, field plates 32a, and 32c would also divide other adjacent dielectric layers, as will be described in more detail with respect to FIGS. 3A and 3B. Moreover, the number of longitudinal dividing field plates is dependent on the number of SOI stripes.

The length of the plurality of longitudinal dividing field plates 32a, 32b and 32c is slightly shorter than the length of the dielectric layers 22a and 22b. Thus, the end edges of the plurality of longitudinal dividing field plates 32a, 32b and 32c are layered with dielectric which may be part of dielectric layer 22a and/or dielectric layer 22b, as best seen in FIG. 3A.

In view of the foregoing, it can be readily seen that the MOS field plate multi-capacitor structure 10 includes MOS capacitor 20a, which is embodied by the longitudinal dividing field plates 32a and 32b, SOI stripe 16a and dielectric layer 22a, and MOS capacitor 20b, which is embodied by the longitudinal dividing field plates 32b and 32c, SOI stripe 16b and dielectric layer 22b. Furthermore, since the MOS capacitors 20a and 20b are juxtaposed the common field plate, namely, the top longitudinal field plate 38 is shared thereby. The field plates 32a, 32b, 32c and 38 are made of a metallic or a polysilicon material.

In the embodiment of FIGS. 1 and 2, the longitudinal dividing field plates 32a, 32b, and 32c extend down to the semiconductor substrate 12 in via (route) 42 and is electrically shorted to the semiconductor substrate 12. In general there is an ohmic connection between the longitudinal dividing field plates 32a, 32b, and 32c extending down to the semiconductor substrate 12.

In summary, each SOI stripe 16a and 16b is completely enclosed longitudinally by the MOS field plate capacitor 20a and 20b defined by sequential deposition of a dielectric and a conducting multi-capacitor field plate layer 30. In other words, the end exterior periphery surfaces of both the SOI stripes 16a and 16b are not bounded by the dielectric layers 22a and 22b, respectively, and the conducting multi-capacitor field plate layer 30. Moreover, in the exemplary embodiment, the end exterior periphery surfaces of the dielectric layers 22a and 22b are not bounded by the conducting multi-capacitor field plate layer 30. In profile, the conducting multi-capacitor field plate layer 30 of a single MOS field plate capacitor 20a or 20b has a generally inverted "U"-shaped.

In the exemplary, embodiment, the geometric shape of the SOI stripe 16a (shown in cross-section in FIG. 2) does not have to be square or rectangular. Instead, other geometries such as, without limitation, circular or cylindrical geometries are also usable as long as the cross-section of the SOI stripe 16a and the conducting multi-capacitor field plate layer 30 are of similar, cross-section and are concentrically scaled. In the exemplary embodiment, the thickness T1 of the buried insulating layer 28a is substantially the same as the thickness T2 of the top insulating layer 28b. The thickness T3 of the SOI stripe 16a centers it between the buried insulating layer 28a and the top insulating layer 28b. Likewise, the SOI stripe 16b is centered between the buried insulating layer 28a' and the top insulating layer 28b'.

An advantage of the three-dimensional MOS multi-capacitor structure 10 is a higher charge slope in the drift region as compared to the prior art for the same breakdown voltage. While not wishing to be bound by theory, the three-dimensional MOS multi-capacitor structure 10 leads to an improvement in specific "on" resistance and saturated current flow.

The fabrication process of the three-dimensional MOS multi-capacitor structure 10 will now be described in detail below.

Step 1 of the fabrication process includes selecting the thicknesses T1 and T3 for the buried insulating layer 28' and the SOI layer 16 (which includes the area between the solid line 1 and the line 1' shown in phantom) for a specific application voltage. Initially the SOI layer 16 extends over the buried insulating layer 28'. In the exemplary embodiment, for a application voltage of 700V, the SOI layer 16 has a 1.0 micron thickness (T3) and the buried insulating layer 28' has a thickness of 3.0 microns (T1).

Step 2 of the fabrication process includes doping the SOI layer 16 with a graded charge profile to set a desired monotonic electric field in the drift region.

Step 3 of the fabrication process includes anisotropically etching the SOI layer 16 to form the individual SOI stripes 16a and 16b on the top surface (solid line 1) of the buried insulating layer 28'.

Step 4 of the fabrication process includes subsequent deposition of the dielectric to form a top insulating layer 28.

Step 5 of the fabrication process includes etching in the center of the top insulating layer 28 and the buried insulating layer 28', between adjacent SOI stripes 16a and 16b, a trench-type geometry to create and expose a via (route) 42 to the substrate 12 thereby forming parallel top insulating layers 28b and 28b' and parallel buried insulating layers 28a and 28a' for MOS capacitors 20a and 20b, respectively. As can be appreciated, a via would be created in the top insulating layer 28 and the buried insulating layer 28' between any two adjacent SOI stripes. Thus, vias are created for field plates 32a and 32c to extend to substrate 12.

Step 6 of the fabrication process includes a refill process with a metal or polysilicon to create the conducting multi-capacitor field plate layer 30 which is superimposed on top of the dielectric layers 22a and 22b and between adjacent dielectric layers 22a and 22b which longitudinally circumscribe adjacent SOI stripes 16a and 16b.

The conduction electrode (conducting multi-capacitor field plate layer 30) of the MOS multi-capacitor structure 10 completely encapsulates, longitudinally, the graded-doped SOI stripes 16a and 16b, thus depleting the SOI stripes 16a or 16b from all sides upon application of a bias voltage.

Step 7 of the fabrication process includes electrically shorting the conducting multi-capacitor field plate layer 30 to the semiconductor substrate 12.

The resultant structure of the fabrication process is thin drift-region SOI stripes 16a and 16b which are completely enclosed longitudinally by a conducting multi-capacitor field plate layer 30, resulting in three-dimensional depletion upon application of a bias voltage between each individual SOI stripe 16a and 16b and the field plates 32a, 32b,32c and 38 of their individual MOS capacitors 20a and 20b, respectively.

The three-dimensional MOS multi-capacitor structure 10 of the present invention is not limited to high voltage applications. Appropriate selection of the dielectric layer thickness T1 and SOI layer thickness T3 results in three-dimensional structures which can be used for blocking voltages from 2 to 1000V. In general, the design, as a function of application voltage, involves selecting a maximum electric field strength in the silicon (semiconductor substrate layer 12) and the dielectric layers.

Figure 4:
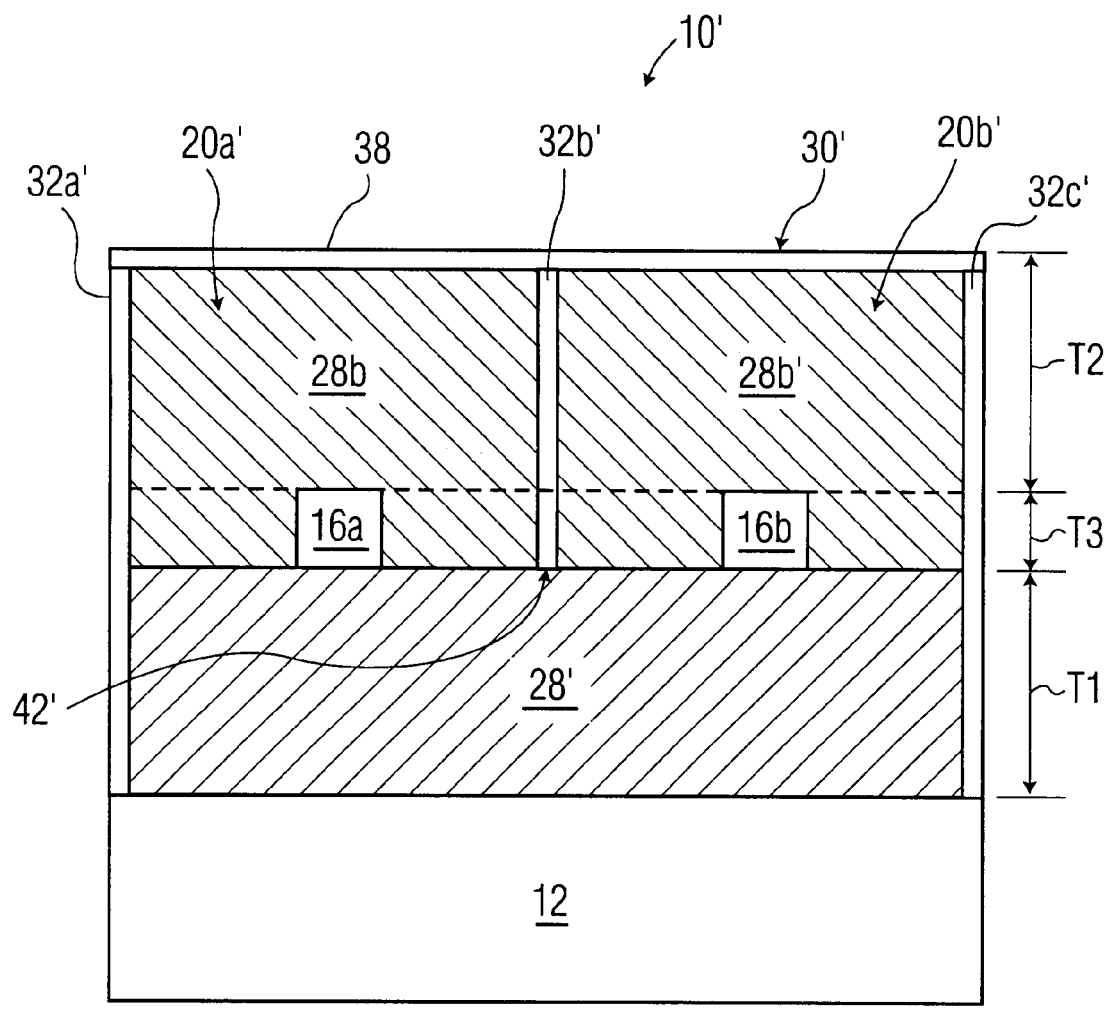
FIG. 4 illustrates an alternate embodiment of the three-dimensional MOS multi-capacitor structure of the present invention.

FIG. 4 illustrates a simpler alternative embodiment for fabricating the MOS field plate multi-capacitor structure 10'.

The MOS field plate multi-capacitor structure 10' is similar to the MOS field plate multi-capacitor structure of the embodiment of FIGS. 1 and 2, except that vias are not etched through the buried insulating layer 28' to the substrate 12. Instead, the buried insulation layer 28' is a solid layer and does not have vias etched therethrough.

The MOS field plate multi-capacitor structure 10' includes MOS capacitors 20a' and 20b' which extend to the top surface of the buried insulating layer 28'. The longitudinal dividing field plates 32a', 32b' and 32c' extend down to the top surface of the buried insulating layer 28'. A via (route) 42' is created through the top insulating layer 28 forming the parallel top insulating layers 28b and 28b' down to the buried insulating layer 28'.

As can be appreciated, the embodiment of FIG. 4 is somewhat easier to construct than the one shown in FIG. 1, since the deposition of the conducting multi-capacitor field plate layer 30' is not extended to the substrate 12. In this embodiment, there is a metal-to-dielectric or insulator connection between the conducting multi-capacitor field plate layer 30' and the buried insulating layer 28'.

Referring now to FIG. 3A, a top view of the thin-layer SOI device 100, is shown. In the exemplary embodiment, the thin-layer SOI device 100 is a lateral double-diffused metal-oxide semiconductor (LDMOS) device. Hence, the description herein will be related to the structure of the LDMOS device which is a metal-oxide semiconductor field effect transistor (MOSFET). The LDMOS device includes a three-dimensional MOS multi-capacitor structures 110. The three-dimensional MOS multi-capacitor structure 110 is essentially the same as the three-dimensional MOS multi-capacitor structure 10 shown in FIGS. 1 and 2, except that it includes SOI stripes 116a, 116b, 116c, and 116d and MOS capacitors 120a, 120b, 120c and 120d (MOS capacitors 120a and 120d shown in part). Furthermore, the top longitudinal field plate 138 of the conducting multi-capacitor field plate layer 130 is partially shown and the dielectric layers 122a, 122b, 122c and 122d are shown cross-hatched and removed over the longitudinal top periphery surface of the SOI stripes 116a, 116b, 116c and 116d for clarity.

The LDMOS device includes an SOI layer 116 which extends from drain 160 to source 150 from which the SOI stripes 116a, 116b, 116c, and 116d. The overall contour of the top view of the SOI layer 116 is an "I"-beam configuration. The drain 160 is a shallow N layer which extends along the width $W_c$ of the channel and is also elongated in a plane perpendicular to the longitudinal dividing field plates 132a, 132b, 132c at one end of the SOI stripes 116a, 116b, 116c, and 116d.

The LDMOS device further includes a polysilicon gate 140 which is disposed at the other end of the three-dimensional MOS multi-capacitor structure 110 and is elongated in a plane perpendicular to the longitudinal dividing field plates 132a, 132b, 132c. The source 150 is formed by a first shallow N layer 152a and a second shallow P layer 152b, both of which have a width which is substantially the width $W_c$ of the channel. In this embodiment, the a polysilicon gate 140, a polysilicon stripe is deposited over an un-etched or unpatterned portion of the SOI layer 116.

In the exemplary embodiment, standard self-aligned process modules (drain 160 and source 150) are used to form the active channel of the LDMOS device, diffusing a dopant under a self-aligned polysilicon stripe forming the polysilicon gate 140. In the embodiment of FIG. 3A, the three-dimensional MOS multi-capacitor structure 110 is confined to the drift region of the LDMOS device. Furthermore, the LDMOS device is self-terminated in a conventional manner.

As can be appreciated, the thin-layer SOI device 100 is not only limited to MOSFET active devices. Instead other semiconductor devices, such as, without limitation, JFETs, bipolar, merged MOS/bipolar, etc., can be fabricated with this high voltage handling drift region, described herein.

Figure 3B:
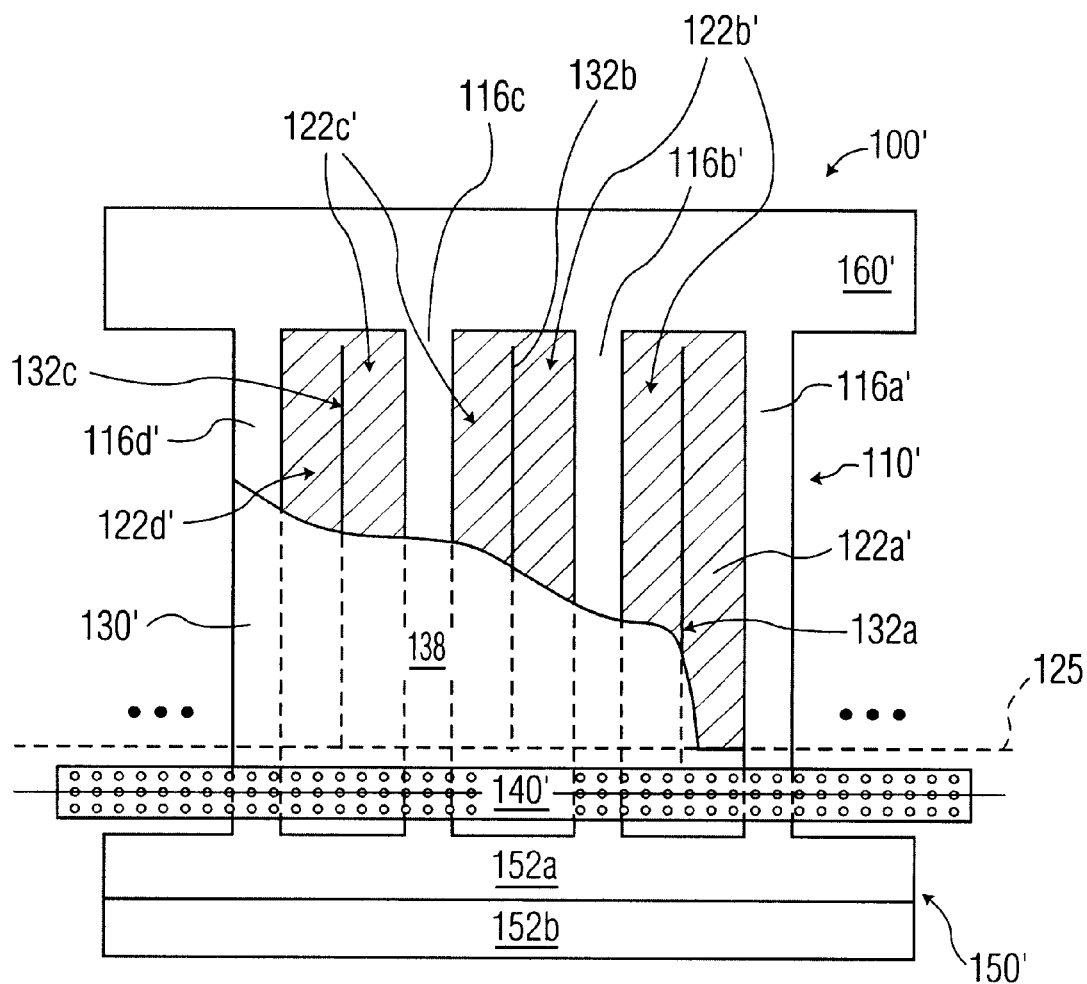
FIG. 3B illustrates an alternative embodiment of the top view of an LDMOS device structure of the present invention employing the three-dimensional MOS multi-capacitor structure of FIG. 1.

Referring now to FIG. 3B, in an alternate embodiment of the thin-layer SOI device 100', the three-dimensional MOS multi-capacitor structure 110' extends from the drain 160' under the polysilicon gate 140' to source 150'. The SOI layer 116' extends through the drain 160' and the source 150'. The polysilicon gate 140' is deposited over the etched SOI stripes 116a', 116b', 116c', and 116d'. Dotted line 125 indicates the end of the dielectric layers 122a', 122b', 122c' and 122d', and the conducting multi-capacitor field plate layer 130.

The embodiment of FIG. 3B, such an arrangement has the benefit of higher channel periphery, as the polysilicon (PS) gate electrode is deposited conformally over patterned SOI stripes 116a', 116b', 116c', and 116d' giving sidewall contributions (sidewalls shown in phantom) to channel current. This arrangement is particularly advantageous for a lateral high-voltage device structure.

Referring still to FIG. 3B, the arrangement of the device 100' or the LSMOS device provides for a lower "on" resistance and the channel periphery is doubled as the polysilicon gate 140' is deposited conformally over the patterned SOI stripes 116a', 116b', 116c' and 116d' which extend beyond the three-dimensional MOS multi-capacitor structure 110'. Moreover, the channel conductivity is dropped by a factor of two (2).

In view of the foregoing, the three-dimensional MOS multi-capacitor structures 110 and 110' of the embodiments of FIGS. 3A and 3B may be designed in accordance with the details of either FIG. 1 or FIG. 4.

Numerous modifications to and alternative embodiments of the present invention will be apparent to those skilled in the art in view of the foregoing description. Accordingly, this description is to be construed as illustrative only and is for the purpose of teaching those skilled in the art the best mode of carrying out the invention. Details of the structure may be varied substantially without departing from the spirit of the invention and the exclusive use of all modifications which come within the scope of the appended claims is reserved.

What is claimed is:

1. A thin-layer silicon-on-insulator (SOI) device comprising:
    a semiconductor substrate;
    a three-dimensional metal-oxide semiconductor (MOS) multi-capacitor structure formed on the substrate, wherein the MOS forms a drift region patterned by a striped geometry of thin, silicon-on-insulator (SOI) stripes and each SOI stripe includes a respective dielectric layer disposed on the semiconductor substrate and;
    a conducting field plate layer superimposed on top of the respective dielectric layer and between adjacent dielectric layers.

2. The device according to claim 1, wherein each of the dielectric layers includes a buried insulating layer interfacing a bottom periphery surface of a respective SOI stripe, and a top insulating layer interfacing remaining periphery surfaces of the respective SOI stripe.

3. The device according to claim 2, wherein the buried insulating layer has a first thickness, each SOI stripe has a second thickness, and the first thickness and the second thickness are for a specific application voltage.

4. The device according to claim 3, wherein each SOI stripe is substantially in a center of the respective dielectric layer.

5. The device according to claim 1, wherein the conducting field plate layer is electrically shorted to the semiconductor substrate.

6. The device according to claim 1, further comprising:
a silicon-on-insulator layer extending from a drain to a source from which the silicon-on-insulator (SOI) stripes are formed; and,
a gate coupled across one end of the three-dimensional MOS multi-capacitor structures and over an unpatterned portion of the silicon-on-insulator layer.

7. The device according to claim 1, further comprising:
a silicon-on-insulator layer extending from a drain to a source from which the silicon-on-insulator (SOI) stripes are formed; and,
a gate coupled over the silicon-on-insulator (SOI) stripes extending beyond the three-dimensional MOS multi-capacitor structure.

8. The device according to claim 7, wherein the drain is comprised of a shallow N layer which extends along the width a channel, and the source is comprised of a shallow N layer and a shallow P layer.

9. A thin-layer silicon-on-insulator (SOI) device comprising:
a silicon-on-insulator (SOI) layer extending from a drain to a source;
a three-dimensional metal-oxide semiconductor (MOS) field plate multi-capacitor structure forming a drift region patterned by a striped geometry of thin, SOI stripes of the SOI layer and biased to deplete a drift charge to achieve multi-dimensional depletion.

10. The device according to claim 9, wherein each SOI stripe includes a respective dielectric layer disposed on a semiconductor substrate, and a conducting field plate layer superimposed on top of the respective dielectric layer.

11. The device according to claim 10, wherein each of the dielectric layers includes:
a buried insulating layer interfacing a bottom periphery surface of a respective SOI stripe; and
a top insulating layer interfacing remaining periphery surfaces of the respective SOI stripe.

12. The device according to claim 11, wherein the buried insulating layer has a first thickness, each SOI stripe has a second thickness, and the first thickness and the second thickness are adapted for a specific application voltage.

13. The device according to claim 12, wherein each SOI stripe is substantially in a center of the respective dielectric layer.

14. The device according to claim 11, wherein the conducting field plate layer extends down to and is electrically shorted to the semiconductor substrate.

15. The device according to claim 11, wherein the conducting field plate layer extends down to the buried insulating layer.

16. The device according to claim 9, wherein the drain is comprised of a shallow N layer which extends along the width a channel, and the source is comprised of a shallow N layer and a shallow P layer.

17. The device according to claim 9, further comprising:
a gate coupled across one end of the three-dimensional MOS multi-capacitor structures and over an unpatterned portion of the silicon-on-insulator layer.

18. The device according to claim 9, further comprising:
a gate coupled over the silicon-on-insulator (SOI) stripes extending beyond the three-dimensional MOS multi-capacitor structure.

* * * * *